United States Patent
Johnson

(10) Patent No.: US 6,181,796 B1
(45) Date of Patent: Jan. 30, 2001

(54) METHOD AND SYSTEM WHICH DRIVES LEFT, RIGHT, AND SUBWOOFER TRANSDUCERS WITH MULTICHANNEL AMPLIFIER HAVING REDUCED POWER SUPPLY REQUIREMENTS

(75) Inventor: Nick M. Johnson, Los Altos, CA (US)

(73) Assignee: National Semiconductor Corporation, Santa Clara, CA (US)

( * ) Notice: Under 35 U.S.C. 154(b), the term of this patent shall be extended for 0 days.

(21) Appl. No.: 09/084,580

(22) Filed: May 26, 1998

Related U.S. Application Data

(63) Continuation-in-part of application No. 09/023,095, filed on Feb. 13, 1998.

(51) Int. Cl.[7] .............................. H04R 5/00; H04R 1/02; H03F 21/00; H03F 1/00
(52) U.S. Cl. ........................ 381/28; 381/27; 381/120; 381/89; 330/199; 330/124 R
(58) Field of Search .................. 381/120, 28, 97, 381/89, 1, 2, 27; 330/127, 199, 124 R

(56) References Cited

U.S. PATENT DOCUMENTS

| | | | |
|---|---|---|---|
| 3,849,600 | * 11/1974 | Ohshima | 381/27 |
| 4,186,273 | * 1/1980 | Dodson | 381/27 |
| 4,346,349 | 8/1982 | Yokoyama | 330/10 |
| 4,443,889 | * 4/1984 | Norgaard | 381/307 |
| 5,027,403 | * 6/1991 | Short et al. | 381/306 |
| 5,243,656 | * 9/1993 | Tanida et al. | 381/28 |
| 5,528,694 | 6/1996 | Van De Kerkhof et al. | 381/27 |
| 5,635,912 | 6/1997 | McCracken | 340/692 |
| 5,642,427 | 6/1997 | Katz et al. | 381/97 |
| 5,673,326 | 9/1997 | Goldfarb | 381/99 |

* cited by examiner

Primary Examiner—Forester W. Isen
Assistant Examiner—Brian Tyrone Pendleton
(74) Attorney, Agent, or Firm—Limbach & Limbach, L.L.P.

(57) ABSTRACT

A system and method which generates amplified signals indicative of left and right stereo channels, and uses the signals to drive transducers for each of subwoofer, left stereo, and right stereo channels. The amplification circuitry is operable with a power supply having low peak current capability (i.e., low peak to average current rating) even when amplifying an input signal pair having highly correlated frequency components, since it spreads the peak current demands imposed on the power supply over a full cycle of each of the highly correlated frequency components. A series-connected pair of left and right channel transducers is driven by left and right channel power amplifiers of the amplification circuitry, and the subwoofer channel transducer is connected in parallel with this transducer pair so that all three transducers are driven by two power amplifiers, thus eliminating the need for a third power amplifier to drive the subwoofer channel transducer. Preferably, the system of the invention includes high pass and low pass filters which direct appropriate subsets of the frequency components of each output signals of the amplification circuitry outputs to an appropriate subset of the transducers.

23 Claims, 4 Drawing Sheets

US 6,181,796 B1

METHOD AND SYSTEM WHICH DRIVES LEFT, RIGHT, AND SUBWOOFER TRANSDUCERS WITH MULTICHANNEL AMPLIFIER HAVING REDUCED POWER SUPPLY REQUIREMENTS

CROSS-REFERENCE TO RELATED APPLICATION

This application is a continuation-in-part of pending U.S. patent application Ser. No. 09/023,095, filed Feb. 13, 1998.

BACKGROUND OF THE INVENTION

1. Field of the Invention

The present invention relates to multiple channel power amplifiers and methods for amplifying multiple channel (e.g., stereo) signals. In preferred embodiments, the invention is a system including circuitry for amplifying left and right channel signals, and a set of three transducers driven by the amplification circuitry (e.g., a loudspeaker for each of left, right, and subwoofer channels).

2. Description of the Related Art

FIG. 1 is a diagram of conventional circuitry for amplifying the left and right channel signals (11L and 11R) comprising a stereo audio signal. Typically, the left channel signal 11L and right channel signal 11R are highly correlated, in the sense that a substantial amount of the power of each is due to frequency components (typically those having low frequency) for which a frequency component of the left channel is at least substantially "in phase" with a corresponding frequency component of the right channel. Referring to FIG. 1, the typical connection of audio loudspeaker 18L to left channel stereo power amplifier 14L (as shown in FIG. 1), and of audio loudspeaker 18R to right channel stereo power amplifier 14R (as shown in FIG. 1) results in superposition of in-phase power supply current demands by the amplifier circuits for the left and right channels, when highly correlated left 11L and right 11R signals are amplified by their respective power amplifiers 14L, 14R to drive loudspeakers 18L, 18R.

To appreciate this, consider the case that highly correlated voltage signals 11R and 11L each have a frequency component (of frequency "f") and these frequency components are in-phase (so that their positive peaks are aligned when plotted along a common time axis, as are the positive peaks shown at the left side of FIG. 1). In this case, during amplification of the in-phase positive peaks of the highly correlated voltage signals 11L, 11R by amplifiers 14L and 14R, the corresponding power supply current demands (ISL and ISR) by the respective power amplifiers (14L and 14R) are in phase. This places a high demand upon the power supply which provides the supply voltage Vs for amplifiers 14R and 14L. Specifically, simultaneous positive peaks of voltage signals 11R and 11L cause amplifiers 14R and 14L to draw simultaneous positive pulses of current (ISL and ISR) from the power supply terminals (zero amplitude or negative amplitude portions of voltage signals 11R and 11L cause amplifiers 14R and 14L to draw a small, positive DC current from the power supply). Thus, in response to in-phase, sinusoidal input signals 11R and 11L, the combined current (ISL+ISR) drawn by both of amplifiers 14L and 14R is a sequence of superposed positive pulses of current ISL+ISR (as represented in FIG. 2). As illustrated, there are high, cumulative current demands by amplifiers 14R and 14L during the first half of each cycle (the period of each cycle is 1/f, where "f" is the frequency of each of sinusoidal input signals 11L and 11R). Thus, the power supply must be designed to operate with high peak to average current.

Unfortunately, most stereo audio sources have highly correlated left and right signals, particularly at the lower frequencies where power levels tend to be the highest. This is due to the generally non-directional nature of low frequency portions of most audio source material, and is thus generally unavoidable.

Above-referenced U.S. patent application Ser. No. 09/023,095 discloses several embodiments of an improved stereo signal amplifier, each operable with a power supply having reduced requirements (relative to those of power supplies of the type needed to operate conventional stereo amplifiers such as that of FIG. 1). FIG. 3 is a schematic diagram of one such embodiment. The system of FIG. 3 has two signal channels: a left channel including amplifier 114L and inverting amplifier 120 (which is a phase conversion circuit which inverts the phase of its input); and a right channel including amplifier 114R. The "right" channel signal 111R is coupled by input coupling capacitor 112R, and amplified by power amplifier 114R. The output of amplifier 114R is coupled via output coupling capacitor 116R to drive transducer 118R (e.g., an audio loudspeaker). The "left" channel voltage signal 111L is coupled by input coupling capacitor 112L, and inverted by inverting amplifier 120. The inverted left channel voltage signal (identified by reference numeral 121 in FIG. 3) is then amplified by power amplifier 114L. The amplified current output of amplifier 114L is coupled via output coupling capacitor 116L to drive transducer 118L (e.g., an audio loudspeaker).

As indicated in FIG. 3, each of transducers 118R and 118L is "polarized" in the sense that it has an inverting terminal (−) and a non-inverting terminal (+). Accordingly, depending upon which terminal (of transducer 118L or 118R) is connected to system ground GND and which terminal is driven by the output signal, the resulting transducer output signal (sound wave 119L or 119R) will have either the same phase or the opposite phase as the phase of the amplified current signal which drives it (i.e., the same phase or the opposite phase as the current signal output from amplifier 114L or 114R). Hence, in the left channel (in which transducer 118L has an inverted connection relative to the connection of right channel transducer 118R), the output 119L of transducer 118L is opposite in phase to the signal asserted at the output of power amplifier 114L. However, the phase shift introduced by inverting amplifier 120 cancels that introduced by transducer 118L, so that output audio wave 119L is in phase with original input signal 111L. Hence, the overall "left channel" phase shift between input voltage signal 111L and audio output signal 119L is approximately zero, just as the overall "right channel" phase shift between input signal 111R and audio output signal 119R is also approximately zero. Accordingly, the FIG. 3 circuit maintains an overall stereo effect while avoiding simultaneous positive current demands from both channels upon the power supply which provides supply voltage Vs across each of amplifiers 114R and 114L.

FIG. 4 shows the peak current demands on the power supply for amplifiers 114R and 114L (in response to in-phase frequency components of highly correlated signals 11R and 11L which are identical to the frequency components of signals 11R and 11L described above with reference to FIG. 2). Due to the phase inversion of left input signal 111L, there is no peak positive current ISL drawn (by amplifier 114L) during the first half of each cycle (amplifier 114L draws only a small, positive DC current $I_{DC}$ from the power supply, and amplifier 114R draws a peak positive current ISR from the power supply, during the first half of each cycle), and there is no peak positive current ISR drawn (by amplifier 114R) during the second half of each cycle (amplifier 114R draws only a small, positive DC current $I_{DC}$, and amplifier 114L draws a peak positive current ISL, from the power supply during the second half of each cycle). Since the peak current demands by the left channel amplifier 114L and the right channel amplifier 114R occur during different (i.e., opposing) half-cycles of the input signals, the power supply for the FIG. 3 system can have a simpler design than the power supply for the FIG. 1 system, in that the power supply for the FIG. 3 system can be designed to operate with lower peak to average current demand than that expected during operation of the FIG. 1 system (and in that the size requirements for the energy storage capacitors of the power supply for FIG. 3 are reduced since the peak current demand is reduced). It will be understood that since the phase shift provided by inverting amplifier 120 is done prior to power amplification of left signal 111L, the power supply requirements by such amplifier 120 add a negligible peak current demand which coincides with the peak current demand of the right channel power amplifier 114R.

FIG. 5 is a schematic diagram of another embodiment of an improved stereo signal amplifier (operable with a power supply having reduced requirements) disclosed in above-referenced U.S. patent application Ser. No. 09/023,095. The FIG. 5 system is identical to that of FIG. 3, except in that a further advantage is realized by replacing output coupling capacitors 116R and 116L of FIG. 3 with a single output decoupling capacitor 216. Decoupling capacitor 216 is connected between system ground GND (or another system reference node) and a common transducer node 218. The individual transducers 118L, 118R are connected between node 218 and the outputs of power amplifiers 114L, 114R via their appropriate inverting (5) and non-inverting (+) terminals as shown. When connected in this way, the highly correlated low frequency amplified output current components (identified as "IOL" in FIG. 5) flow between the transducers 118L, 118R, while the less correlated high frequency output current components ("IOH") are effectively conducted to system ground GND by decoupling capacitor 216 (which can be much smaller than the output coupling capacitors 116L, 116R due to the frequencies of the current components being coupled).

It is contemplated that the circuitry of FIG. 3 or FIG. 5 (possibly including the power supply, but excluding the transducers and input and output capacitors) will be implemented as part of a single integrated circuit (i.e., an integrated circuit in which power amplifiers 114L and 114R, inverting amplifier 120, and possibly also the power supply, are integrated into a single substrate).

SUMMARY OF THE INVENTION

The inventive system is for generating multi-channel sound in response to input signals indicative of multiple audio channels. It includes circuitry for amplifying the input signals, and three or more transducers driven by the amplification circuitry (including a loudspeaker or other transducer for each of a subwoofer channel and left and right stereo channels). The amplification circuitry is operable with a power supply having low peak current capability (i.e., low peak to average current rating) even when amplifying input signals having highly correlated frequency components, as it is configured to spread the peak current demands it imposes on the power supply over a full cycle of each of the highly correlated frequency components. Two of the transducers are connected in series (and driven by two power amplifiers), and the transducer for the subwoofer channel is connected in parallel with the series-connected transducers so that all three transducers are driven by the two power amplifiers. This eliminates the need for an additional power amplifier to drive the subwoofer channel transducer.

In a class of preferred embodiments, the system of the invention includes amplification circuitry (comprising left and right channel power amplifiers) and three transducers driven by the amplification circuitry (one for each of left and right stereo channels and a subwoofer channel). The amplification circuitry draws low peak current from a power supply even while simultaneously amplifying left and right channel signals having highly correlated frequency components, since it is configured to spread the peak current demands it imposes on the power supply over a full cycle of each of the highly correlated frequency components. Transducers for the left and right stereo channels are connected in series. The series-connected transducers are driven by a pair of power amplifiers. The transducer for the subwoofer channel is connected in parallel with the series-connected left and right channel transducers, and is driven by the same two power amplifiers which drive the left and right channel transducers. This eliminates the need for a separate power amplifier to drive the subwoofer channel transducer.

Preferred embodiments of the invention include high pass and low pass filters which direct appropriate subsets of the frequency components of the amplification circuitry outputs to appropriate ones of the transducers For example, a high pass network passes to the left and right channel transducers only frequency components (of the left and right channel power amplifier output) of frequency above a first cutoff value, and a low pass network passes to the subwoofer channel transducer only frequency components (of the right and left channel power amplifier output) of frequency below a second cutoff value (which can be equal to or different than the first cutoff).

It is contemplated that the amplification circuitry (and optionally the power supply which powers it) can be implemented as part of a single integrated circuit (i.e., an integrated circuit in which the amplification circuitry and possibly the power supply are integrated into a single substrate).

Another aspect of the invention is a method for generating multi-channel sound in response to input signals indicative of multiple audio channels, including the steps of amplifying left and right stereo channel input signals (in a manner drawing low peak current from a power supply even when amplifying an input signal pair having highly correlated frequency components, by spreading the peak current demands on the power supply over a full cycle of each of the highly correlated frequency components) to generate an amplified signal pair, and driving three or more transducers (including a transducer for each of a subwoofer channel and left and right stereo channels) with the amplified signal pair.

DETAILED DESCRIPTION OF THE INVENTION

A first preferred embodiment of the present invention will be described with reference to FIG. 6. The FIG. 6 system is identical to that of above-described FIG. 5, except in that it includes subwoofer transducer 118W (connected in parallel with the series-connected left and right channel transducers 118L and 118R). Subwoofer transducer 118W is driven by the low frequency components of the outputs of amplifiers 114R and 114L. The non-inverting terminals of transducers 118R and 118W are connected to the output of power amplifier 114R, and the inverting terminals of transducers 118L and 118W are connected to the output of power amplifier 114L.

Subwoofer transducer 118W is designed to convert low frequency components of the output of amplifiers 114R and 114L to low frequency sound waves with high efficiency (but to convert relatively high frequency components of the output of amplifiers 114R and 114L to sound waves with low or zero efficiency). Left and right channel transducers 118L and 118R are designed to convert a broader range of frequency components (including low frequency and relatively high frequency components) of the output of amplifiers 114R and 114L to sound waves with good efficiency.

Figure 5:
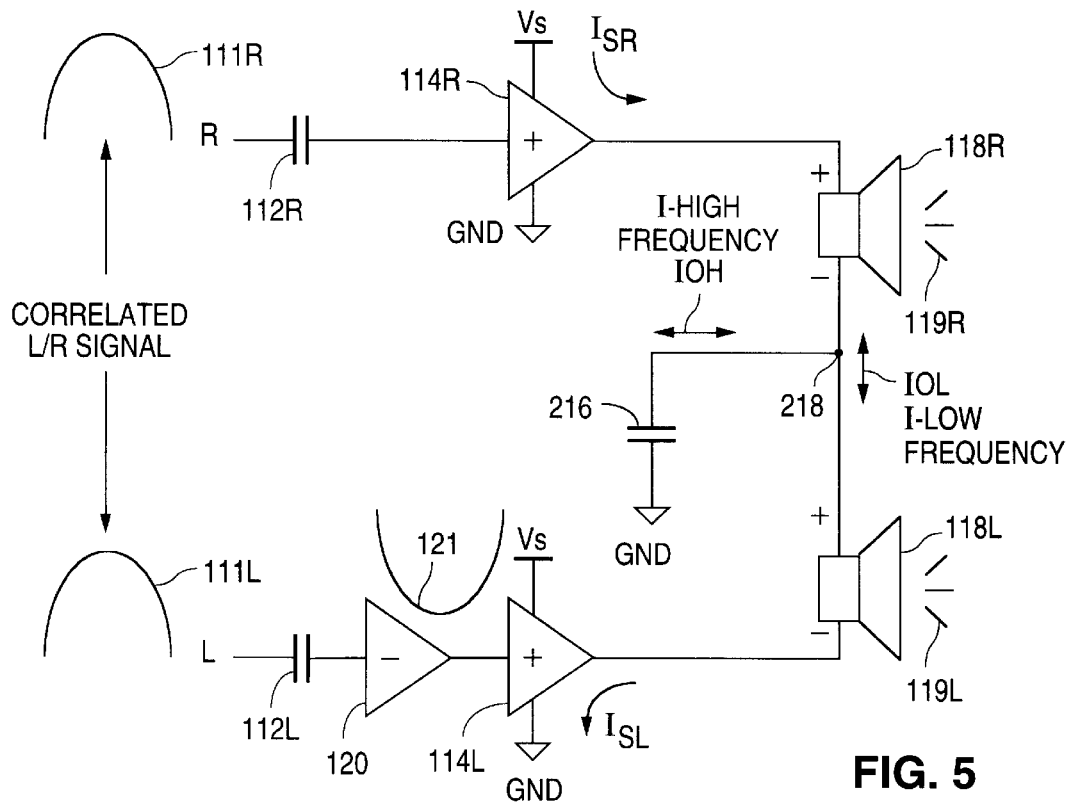
FIG. 5 is a schematic diagram of another improved stereo audio amplifier system disclosed in the parent (application Ser. No. 09/023,095) of the present application.
Figure 6:
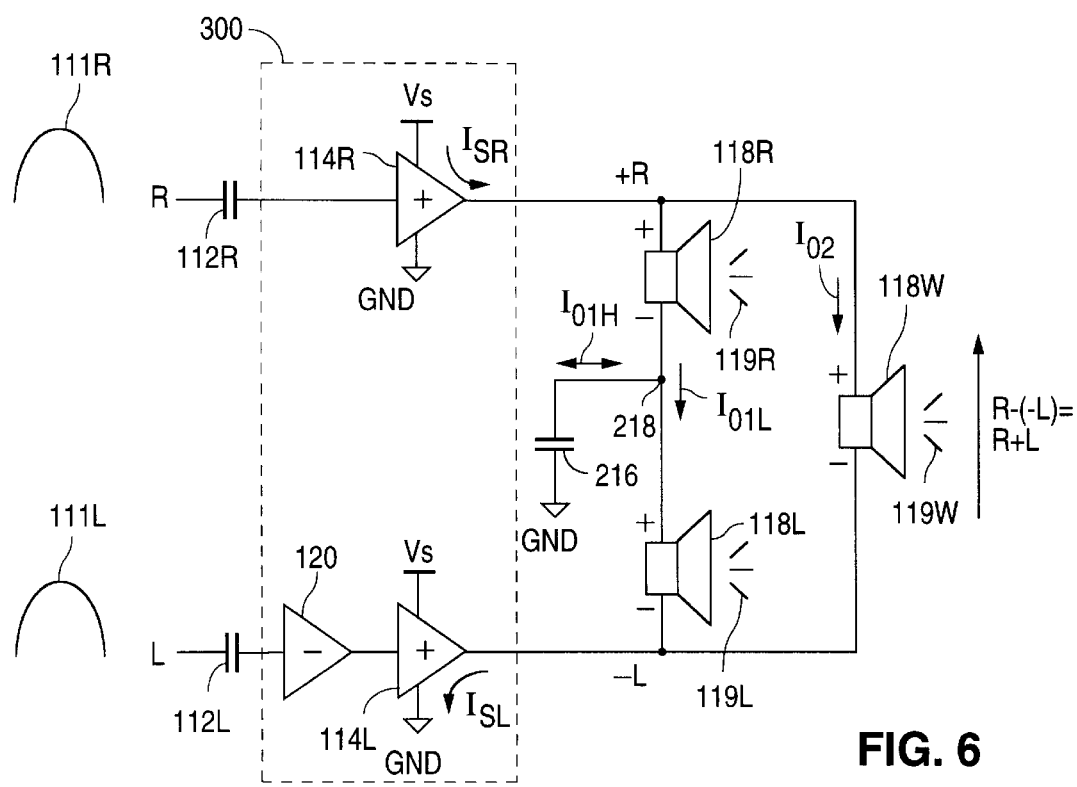
FIG. 6 is a schematic diagram of a first preferred embodiment of the present invention.

As in the FIG. 5 embodiment, the description of the FIG. 6 embodiment assumes that left channel input signal 111L and right channel input signal 111R are highly correlated, with a substantial number (e.g., all or substantially all) of the low frequency components of signal 111L being in-phase (or substantially in-phase) with corresponding low frequency components of signal 111R, and the relatively high frequency components of signal 111L having no particular correlation with the relatively high frequency components of signal 111R.

With transducers 118W, 118L, and 118R connected as shown in FIG. 6, a portion (identified as "IO2") of the net current output (ISR−ISL) of amplifiers 114R and 114L flows through transducer 118W, and the remaining portion ("IO1") of the net current output (ISR−ISL) of amplifiers 114R and 114L flows through transducers 118R and 118L (and charges and discharges capacitor 216). The highly correlated low frequency components (identified as "IOL1" in FIG. 6) of current IO1 flow between the transducers 118L and 118R, while the high frequency components (identified as "IOH1" in FIG. 6) of current IO1 are effectively conducted to system ground GND (or other system reference node to which capacitor 216 is coupled) by decoupling capacitor 216. The high frequency components of "IOH1" due to the right channel ("IOH1R") have no particular correlation with the high frequency components of "IOH1" which are due to the left channel ("IOH1L").

The highly correlated low frequency components of current IO2 are converted efficiently to sound waves by transducer 118W, and the higher frequency components of current IO2 are not converted (or are converted with very low efficiency) to sound waves by transducer 118W. Thus, the audio output of transducer 118W is perceived by the listener as a low frequency (subwoofer) channel of a stereo audio signal.

Transducer 118R converts both the high frequency components "IOH1R" (due to the right channel) and the highly correlated low frequency components of current IO1L efficiently to sound waves. Transducer 118L inverts the phase of, and efficiently converts to sound waves, the high frequency components "IOH1L" (due to the left channel) as well as the highly correlated low frequency components of current IO1L. Thus, the audio output of transducers 118L and 118R are perceived by the listener as left and right channels, respectively, of the stereo audio signal.

In the FIG. 6 embodiment, a power supply (identical to power supply circuit 400 of FIG. 7) is connected (as is circuit 400 in FIG. 7) to provide supply voltage Vs across each of amplifiers 114R, 114L, and 120.

It is contemplated that amplifier circuitry 300 of FIG. 6 (possibly including the power supply which powers amplifiers 120, 114R, and 114L, but excluding transducers 118L, 118R, and 118W, and capacitors 112R, 112L, and 216) will be implemented as part of a single integrated circuit (i.e., in which power amplifiers 114L and 114R, inverting amplifier 120, and possibly the power supply are integrated into a single substrate). Alternatively, the power supply is not integrated with amplifier circuitry 300.

Figure 1:
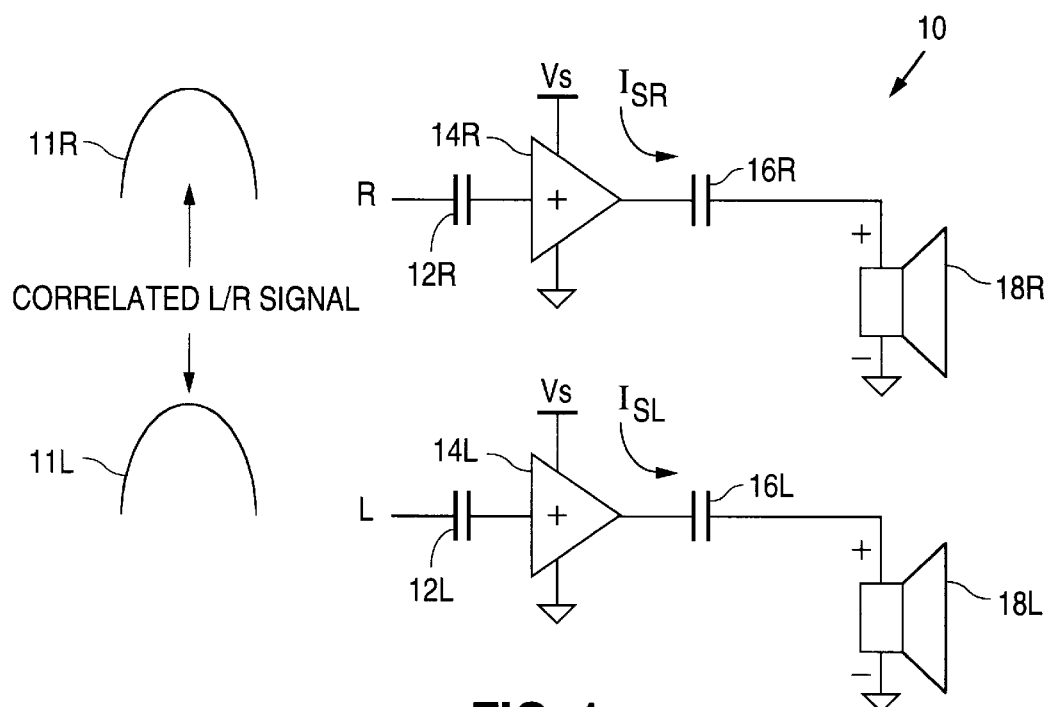
FIG. 1 is a schematic diagram of a conventional stereo audio amplifier system.
Figure 2:
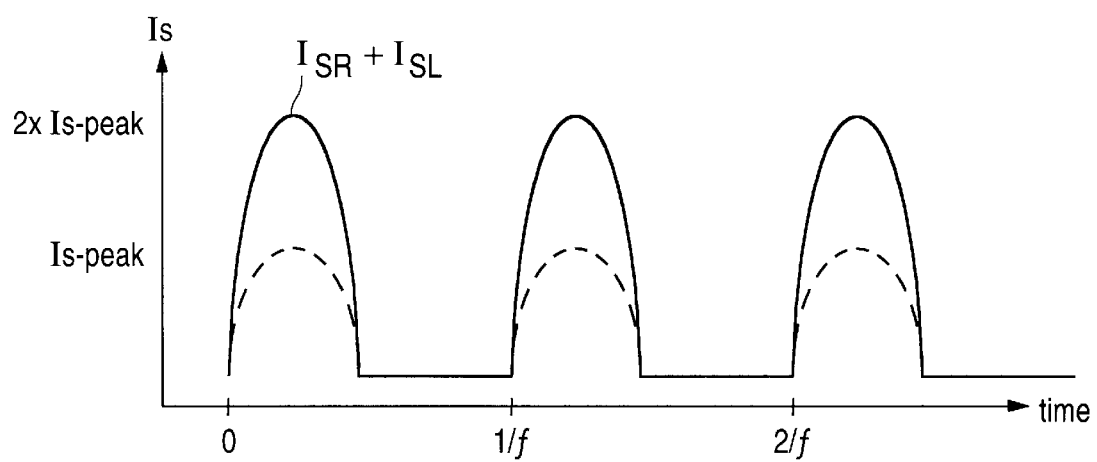
FIG. 2 is a graph of power supply current drawn (as a function of time) by the amplifier system of FIG. 1 (in response to a sequence of highly correlated positive pulses of left and right channel input signals).
Figure 3:
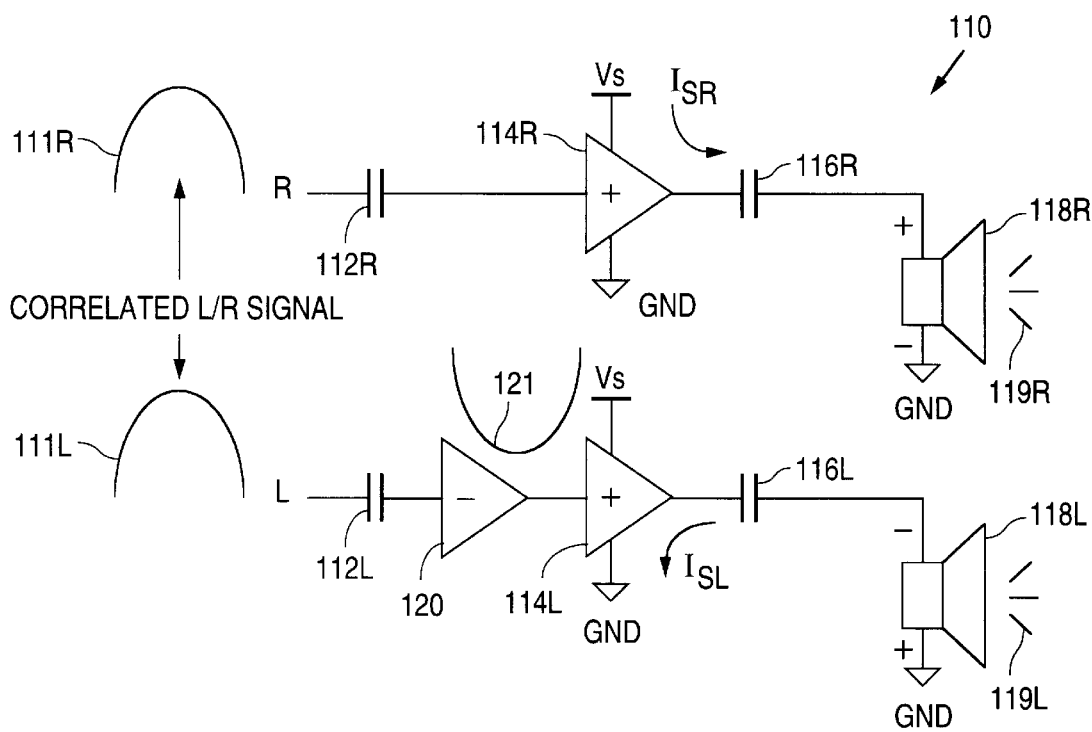
FIG. 3 is a schematic diagram of an improved stereo audio amplifier system, disclosed in the parent (application Ser. No. 09/023,095) of the present application.
Figure 4:
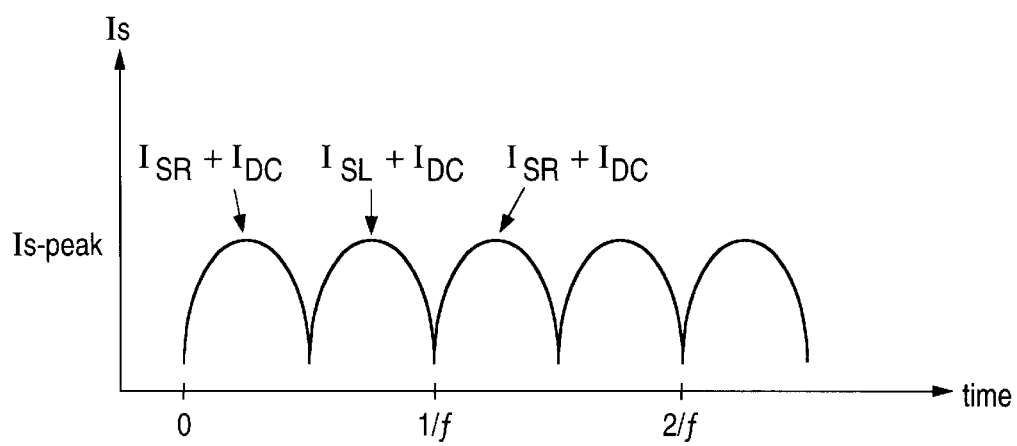
FIG. 4 a graph of power supply current drawn (as a function of time) by the amplifier system of FIG. 3 (in response to a sequence of highly correlated positive pulses of left and right channel input signals).

The advantages of the FIG. 6 embodiment of the invention include the following:

it drives a subwoofer transducer as well as left and right channel transducers using a single amplifier 300 (which can be implemented as a single integrated circuit) rather than two amplifiers (e.g., one integrated circuit amplifier for the left and right channel transducers, and another integrated circuit amplifier for the subwoofer channel transducer);

one moderately sized decoupling capacitor (capacitor 216) replaces two large electrolytic coupling capacitors (of the type used in the FIG. 1 circuit). Although the FIG. 5 circuit similarly requires only one such decoupling capacitor, the FIG. 6 circuit drives a subwoofer transducer as well as left and right channel transducers using only a single amplifier (which can be implemented as a single integrated circuit) and one decoupling capacitor;

substantial space savings can be achieved by using a single amplifier (which can be implemented as a single integrated circuit) rather than two amplifiers (e.g., one integrated circuit amplifier for the left and right channel transducers and another for the subwoofer channel transducer), and using one moderately sized decoupling capacitor rather than two large coupling capacitors; and it enables all three of a subwoofer transducer and left and right channel transducers to be driven by a single amplifier whose power supply comprises an off-line, flyback type of switching regulator. Such a power supply can be implemented with small energy storage capacitors, but has a hard current limiting characteristic due to the fact that each switching cycle can transfer only a relatively fixed amount of energy (depending upon the magnetics which are used). Even with switching frequencies of 100 kHz or more, this current limiting characteristic can result in severe current limiting during the superimposed peak current demands which occur in prior art circuits of the type described with reference to FIG. 1, but this current limiting characteristic will typically neither degrade nor prevent operation of the FIG. 6 circuit (due to its reduced peak current demand).

The FIG. 6 embodiment does not employ filtering to prevent low frequency components from reaching stereo transducers 118R and 118L, and to prevent high frequency components from reaching transducer 118W.

For multichannel audio systems that consuming no more than moderate power (e.g., systems for driving monitor speakers), this is not a significant drawback since all transducers are running well below maximum power handling capability.

Figure 7:
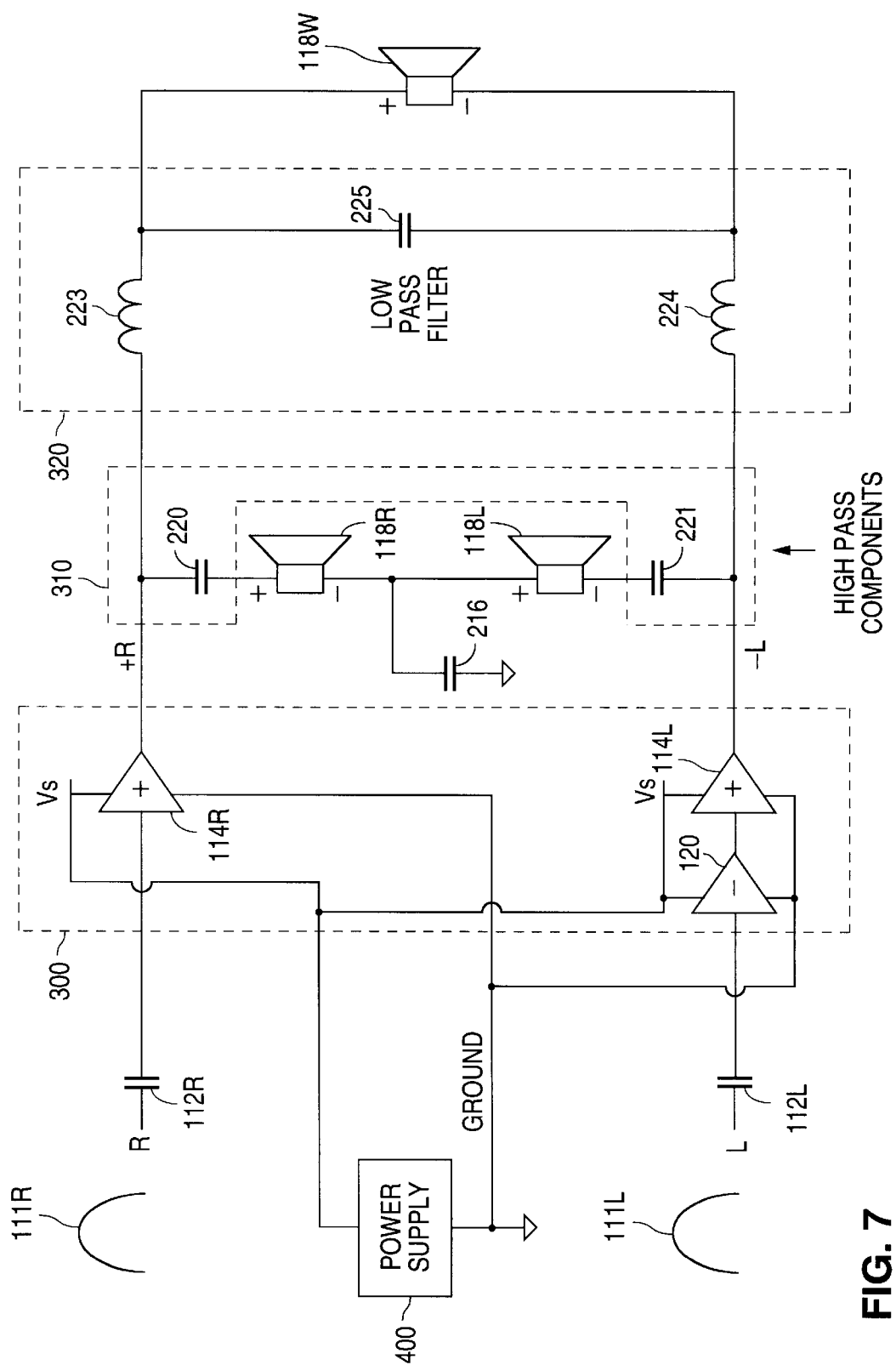
FIG. 7 is a schematic diagram of a second preferred embodiment of the present invention.

FIG. 7 is a schematic diagram of a second preferred embodiment of the present invention. The FIG. 7 embodiment is identical to that of FIG. 6 except in that FIG. 7 includes low impedance cross-over networks 310 and 320 for filtering the output of amplifier circuitry 300 so as to direct appropriate subsets of the frequency components of amplified output current to appropriate ones of transducers 118R, 118L, and 118W.

High pass network 310 comprises capacitor 220 connected between transducer 118R and the output of amplifier 114R, and capacitor 221 connected between transducer 118L and the output of amplifier 114L. The capacitances of capacitors 220 and 221 are chosen so that network 310 is a high pass filter. Capacitor 220 passes to transducer 118R only frequency components (of amplifier 114R's output signal) of frequency above a relatively low first cutoff frequency, and capacitor 221 passes to transducer 118L only frequency components (of amplifier 114L's output signal) of frequency above a relatively low second cutoff frequency to transducer 118L (the first cutoff frequency can be equal or substantially equal to the second cutoff frequency). Of the frequency components passed from amplifier 114R to transducer 118R, those having relatively low frequency (which are typically highly correlated with corresponding components passed from amplifier 114L to transducer 118L) flow between transducer 118R and transducer 118L, while those of relatively high frequency (which are typically less correlated with corresponding components passed from amplifier 114L to transducer 118L) are effectively conducted to system ground by decoupling capacitor 216. Similarly, of the frequency components passed from amplifier 114L to transducer 118L, those having relatively low frequency (which are typically highly correlated with corresponding components passed from amplifier 114R to transducer 118R) flow between transducer 118L and transducer 118R, while those of relatively high frequency (which are typically less correlated with corresponding components passed from amplifier 114R to transducer 118R) are effectively conducted to system ground by decoupling capacitor 216.

Low pass network 320 comprises capacitor 225 connected across the input and output terminals of transducer 118W, inductor 223 connected between transducer 118W and the output of amplifier 114R, and inductor 224 connected between transducer 118L and the output of amplifier 114L. The characteristics of elements 223, 224, and 225 are chosen so that network 320 passes to transducer 118W only frequency components (of amplifier 114R's output signal and amplifier 114L's output signal) below a relatively low cutoff frequency. This cutoff frequency can be the same as or different than the first cutoff frequency and/or the second cutoff frequency of filter 310.

Still with reference to FIG. 7, power supply circuit 400 maintains supply voltage $V_S$ across each of amplifiers 114R, 114L, and 120.

In variations on the FIG. 7 embodiment, any of a variety of cross-over networks (which can have conventional design) are substituted for one or both of cross-over networks 310 and 320 (of FIG. 7) to steer appropriate low frequency components of the amplified output of amplifiers 114R and 114L to subwoofer transducer 118W, and to steer frequency components of the amplified output of amplifiers 114R and 114L (which are above an appropriate cutoff frequency) to left and right channel transducers 118R and 118L.

The foregoing discussion has been in the context of stereo audio amplification systems (for amplifying left and right channel stereo input signals). However, it will be evident to those of ordinary skill in the art that the general techniques discussed above can also be used in systems which amplify more than two channels of input signals are amplified (to drive three or more transducers). For example, in a four channel audio signal playback system in which four amplifier channels are employed to amplify four input voltage signals to drive five transducers (including a subwoofer channel transducer) to produce an audio output. In such system, the second, third and fourth channels could be designed to introduce overall input-to-output phase shifts of +90°, +180° and +270° as compared to the corresponding phase shift, if any, introduced by the first channel. By spreading the peak power supply current demands across the full input signal cycle, the instantaneous peak current demand is less than it would otherwise be without such phase offsets (when amplifying multiple input signals having highly correlated frequency components). Two of the transducers (driven by two power amplifiers) are connected in series, and the transducer for the subwoofer channel is connected in parallel with the series-connected transducers, so that all three transducers are driven by the two power amplifiers. This eliminates the need for an additional power amplifier to drive the subwoofer channel transducer (so that all five transducers can be driven by not more than four power amplifiers).

The inventive method is a method for generating multi-channel sound in response to input signals indicative of multiple audio channels, which includes the steps of amplifying left and right stereo channel input signals (in a manner drawing low peak current from a power supply even when amplifying an input signal pair having highly correlated frequency components, by spreading the peak current demands on the power supply over a full cycle of each of the highly correlated frequency components) to generate an amplified signal pair, and driving three or more transducers (including a transducer for each of a subwoofer channel and left and right stereo channels) with the amplified signal pair. The method of operation of each above-described embodiment of the inventive system is an example of the inventive method.

Various other modifications and alterations in the structure and method of operation of the inventive system, and in the inventive method, will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A system for generating multi-channel sound in response to input signals indicative of multiple audio channels, said system including:

amplification circuitry coupled to receive the input signals, and configured to amplify the input signals with low peak current demand even when the input signals have highly correlated frequency components; and a first transducer, a second transducer, and a third transducer coupled to the amplification circuitry, said amplification circuitry comprising:

first amplifier circuitry configured to receive and amplify a first one of the input signals to generate and assert at a first output node a first amplified signal, wherein the first amplifier circuitry asserts an amplified frequency component of the first amplified signal having a first phase, in response to a frequency component of the first one of the input signals having a first frequency and a first input signal phase; and second amplifier circuitry configured to receive and amplify a second one of the input signals to generate and assert at a second output node a second amplified signal, wherein the second amplifier circuitry asserts an amplified frequency component of the second amplified signal in response to a frequency component of the second one of the input signals having the first frequency and a phase at least substantially equal to the first input signal phase, wherein the amplified frequency component of the second amplified signal has a second phase which lags the first phase by a phase delay at least substantially equal to one-half cycle of said frequency component of the second one of the input signals, wherein the first transducer is coupled to the first output node with a first polarity, the second transducer is coupled between the second output node and the first transducer with a polarity opposite to the first polarity so that the first transducer and the second transducer introduce a phase shift, in the amplified frequency component of the second amplified signal relative to the amplified frequency component of the first amplified signal, which cancels said phase delay, and the third transducer is coupled between the first output node and the second output node in parallel with the first transducer and the second transducer, wherein the first transducer is coupled to the second transducer at a third node, and also including a capacitor coupled between a system reference node and the third node, and wherein the first transducer radiates sound indicative of a right stereo channel in response to the first amplified signal, the second transducer radiates sound indicative of a left stereo channel in response to the second amplified signal, and the third transducer radiates sound indicative of a subwoofer channel in response to the first amplified signal and the second amplified signal.

2. The system of claim 1, wherein:

the first transducer is dc-coupled between the first output node and the third node;

the second transducer is dc-coupled between the second output node and the third node; and the third node is ac-coupled to the system reference node by the capacitor.

3. A system for generating multi-channel sound in response to input signals indicative of multiple audio channels, said system including:

amplification circuitry coupled to receive the input signals, and configured to amplify the input signals with low peak current demand even when the input signals have highly correlated frequency components; and a first transducer, a second transducer, and a third transducer coupled to the amplification circuitry, said amplification circuitry comprising:

first amplifier circuitry configured to receive and amplify a first one of the input signals to generate and assert at a first output node a first amplified signal, wherein the first amplifier circuitry asserts an amplified frequency component of the first amplified signal having a first phase, in response to a frequency component of the first one of the input signals having a first frequency and a first input signal phase; and second amplifier circuitry configured to receive and amplify a second one of the input signals to generate and assert at a second output node a second amplified signal, wherein the second amplifier circuitry asserts an amplified frequency component of the second amplified signal in response to a frequency component of the second one of the input signals having the first frequency and a phase at least substantially equal to the first input signal phase, wherein the amplified frequency component of the second amplified signal has a second phase which lags the first phase by a phase delay at least substantially equal to one-half cycle of said frequency component of the second one of the input signals, wherein the first transducer is coupled to the first output node with a first polarity, the second transducer is coupled between the second output node and the first transducer with a polarity opposite to the first polarity so that the first transducer and the second transducer introduce a phase shift, in the amplified frequency component of the second amplified signal relative to the amplified frequency component of the first amplified signal, which cancels said phase delay, and the third transducer is coupled between the first output node and the second output node in parallel with the first transducer and the second transducer, wherein the first amplifier circuitry is a right channel power amplifier, and the second amplifier circuitry comprises a left channel power amplifier in series with an inverting amplifier, and wherein the system also includes:

a power supply coupled to the right channel power amplifier and to the left channel power amplifier, and configured to provide a supply voltage across each of the right channel power amplifier and the left channel power amplifier such that the right channel power amplifier draws right channel peak current from the power supply during amplification of the frequency component of the first one of the input signals, the power supply sinks left channel peak current from the left channel power amplifier during amplification of the frequency component of the second one of the input signals, and the left channel peak current does not coincide with the right channel peak current.

4. A method for generating multi-channel sound in response to input signals indicative of multiple audio channels, said method comprising the steps of:

amplifying a first one of the input signals and a second one of the input signals with low peak current demand even when the first one of the input signals and the second one of the input signals have highly correlated frequency components, to generate a first amplified signal in response to the first one of the input signals and a second amplified signal in response to the second one of the input signals, including by generating an amplified frequency component of the first amplified signal in response to a frequency component of said first one of the input signals having a first frequency and a first input signal phase, said amplified frequency component of the first amplified signal having a first phase, and generating an amplified frequency component of the second amplified signal in response to a frequency component of said second one of the input signals having the first frequency and a phase at least substantially equal to the first input signal phase, so that the amplified frequency component of the second amplified signal has a second phase which lags the first phase by a phase delay at least substantially equal to one-half cycle of the frequency component of the second one of the input signals; and driving a first transducer coupled with a first polarity to a first output node, a second transducer coupled with a second polarity between the first transducer and a second output node, and a third transducer connected between the first output node and the second output node, by asserting the first amplified signal to the first output node and asserting the second amplified signal to the second output node thereby causing the first transducer, the second transducer, and the third transducer to emit said multi-channel sound, wherein the second polarity is opposite to the first polarity so that the first transducer and the second transducer introduce a phase shift, in the amplified frequency component of the second amplified signal relative to the amplified frequency component of the first amplified signal, which cancels said phase delay, wherein the step of generating the first amplified signal includes amplifying the first one of the input signals in a right channel power amplifier, and the step of generating the second amplified signal includes amplifying the second one of the input signals in an inverting amplifier and amplifying an output of the inverting amplifier in a left channel power amplifier; and providing a supply voltage across each of the right channel power amplifier and the left channel power amplifier such that the right channel power amplifier draws right channel peak current from the power supply during amplification of the frequency component of the first one of the input signals, the power supply sinks left channel peak current from the left channel power amplifier during amplification of the frequency component of the second one of the input signals, and the left channel peak current does not coincide with the right channel peak current.

5. A system for generating multi-channel sound in response to input signals indicative of multiple audio channels, said system including:

a first channel power amplifier coupled and configured to receive a first one of the input signals and to assert a first amplified signal at a first output node in response to the first one of the input signals, an inverting amplifier coupled to receive a second one of the input signals and to assert an inverted signal in response thereto;

a second channel power amplifier coupled and configured to receive the inverted signal and to assert a second amplified signal at a second output node in response to the inverted signal, wherein the first channel power amplifier is configured to assert an amplified frequency component of the first amplified signal in response to a frequency component of the first one of the input signals having a first frequency and a first input signal phase, the amplified frequency component of the first amplified signal has a first phase, the second channel power amplifier and the inverting amplifier are configured to assert an amplified frequency component of the second amplified signal in response to a frequency component of the second one of the input signals having the first frequency and a phase at least substantially equal to the first input signal phase, wherein the amplified frequency component of the second amplified signal has a second phase which lags the first phase by a phase delay at least substantially equal to one-half cycle of said frequency component of the second one of the input signals;

a power supply coupled to the first channel power amplifier and to the second channel power amplifier, and configured to provide a supply voltage across each of the first channel power amplifier and the second channel power amplifier such that the first channel power amplifier draws first channel peak current from the power supply during amplification of the frequency component of the first one of the input signals, the second channel power supply sinks second channel peak current from the second channel power amplifier during amplification of the frequency component of the second one of the input signals, and the first channel peak current does not coincide with the second channel peak current;

a first transducer coupled to the first output node with a first polarity;

a second transducer coupled between the second output node and the first transducer with a polarity opposite to the first polarity so that the first transducer and the second transducer introduce a phase shift, in the amplified frequency component of the second amplified signal relative to the amplified frequency component of the first amplified signal, which cancels said phase delay; and a third transducer coupled between the first output node and the second output node in parallel with the first transducer and the second transducer.

6. The system of claim 5, wherein the first transducer is coupled to the second transducer at a third node, and also including a capacitor coupled between a system reference node and the third node, and wherein the first transducer radiates sound indicative of a right stereo channel in response to the first amplified signal, the second transducer radiates sound indicative of a left stereo channel in response to the second amplified signal, and the third transducer radiates sound indicative of a subwoofer channel in response to the first amplified signal and the second amplified signal.

7. The system of claim 6, wherein:

the first transducer is dc-coupled between the first output node and the third node;

the second transducer is dc-coupled between the second output node and the third node; and the third node is ac-coupled to the system reference node by the capacitor.

8. The system of claim 5, also including:

a high pass network coupled between the first output node and the first transducer and between the second output node and the second transducer, the high pass network being configured to pass from the first output node to the first transducer only frequency components of the first amplified signal having frequency above a first cutoff value, and to pass from the second output node to the second transducer only frequency components of the second amplified signal having frequency above a second cutoff value; and a low pass network coupled between the first output node and the third transducer and between the second output node and the third transducer, the low pass network being configured to pass to the third transducer only frequency components of the first amplified signal and the second amplified signal having frequency below a third cutoff value.

9. The system of claim 8, wherein the first cutoff value is at least substantially equal to the second cutoff value, and the second cutoff value is at least substantially equal to the third cutoff value.

10. The system of claim 5, wherein the first channel power amplifier, the inverting amplifier, and the second channel power amplifier are implemented as portions of a single integrated circuit.

11. A system for generating multi-channel sound in response to input signals indicative of multiple audio channels, said system including:

amplification circuitry coupled to receive the input signals, and configured to amplify the input signals with low peak current demand even when the input signals have highly correlated frequency components; and a first transducer, a second transducer, and a third transducer coupled to the amplification circuitry, said amplification circuitry comprising:

first amplifier circuitry configured to receive and amplify a first one of the input signals to generate and assert at a first output node a first amplified signal, wherein the first amplifier circuitry asserts an amplified frequency component of the first amplified signal having a first phase, in response to a frequency component of the first one of the input signals having a first frequency and a first input signal phase; and second amplifier circuitry configured to receive and amplify a second one of the input signals to generate and assert at a second output node a second amplified signal, wherein the second amplifier circuitry asserts an amplified frequency component of the second amplified signal in response to a frequency component of the second one of the input signals having the first frequency and a phase at least substantially equal to the first input signal phase, wherein the amplified frequency component of the second amplified signal has a second phase which lags the first phase by a phase delay at least substantially equal to one-half cycle of said frequency component of the second one of the input signals, wherein the first transducer is coupled to the first output node with a first polarity, the second transducer is coupled between the second output node and the first transducer with a polarity opposite to the first polarity so that the first transducer and the second transducer introduce a phase shift, in the amplified frequency component of the second amplified signal relative to the amplified frequency component of the first amplified signal, which cancels said phase delay, the third transducer is coupled between the first output node and the second output node in parallel with the first transducer and the second transducer, the first transducer and the second transducer radiate sound indicative of a right stereo channel and a left stereo channel in response to the first amplified signal and the second amplified signal, and the third transducer radiates sound indicative of a subwoofer channel in response to the first amplified signal and the second amplified signal.

12. The system of claim 11, wherein the first transducer is coupled to the second transducer at a third node, and also including a capacitor coupled between a system reference node and the third node.

13. The system of claim 12, wherein:

the first transducer is dc-coupled between the first output node and the third node;

the second transducer is dc-coupled between the second output node and the third node; and the third node is ac-coupled to the system reference node by the capacitor.

14. The system of claim 13, wherein the first amplifier circuitry is a right channel power amplifier, and the second amplifier circuitry comprises a left channel power amplifier in series with an inverting amplifier.

15. The system of claim 11, wherein the amplification circuitry is implemented as an integrated circuit.

16. A system for generating multi-channel sound in response to input signals indicative of multiple audio channels, said system including:

amplification circuitry coupled to receive the input signals and configured to amplify the input signals with low peak current demand even when said input signals have highly correlated frequency components;

a first transducer branch coupled to the amplification circuitry, and including a first transducer, a second transducer, and a high pass network; and a second transducer branch coupled to the amplification circuitry, and including a third transducer and a low pass network, wherein the amplification circuitry comprises:

first amplifier circuitry configured to receive and amplify a first one of the input signals to generate and assert at a first output node a first amplified signal, wherein the first amplifier circuitry asserts an amplified frequency component of the first amplified signal having a first phase, in response to a frequency component of the first one of the input signals having a first frequency and a first input signal phase; and second amplifier circuitry configured to receive and amplify a second one of the input signals to generate and assert at a second output node a second amplified signal, wherein the second amplifier circuitry asserts an amplified frequency component of the second amplified signal in response to a frequency component of the second one of the input signals having the first frequency and a phase at least substantially equal to the first input signal phase, wherein the amplified frequency component of the second amplified signal has a second phase which lags the first phase by a phase delay at least substantially equal to one-half cycle of said frequency component of the second one of the input signals, wherein the high pass network is coupled in series with the first transducer and the second transducer between the first output node and the second output node, with the high pass network having a first portion coupled between the first output node and the first transducer and a second portion coupled between the second output node and the second transducer, and the high pass network is configured to pass from the first output node to the first transducer only frequency components of the first amplified signal having frequency above a first cutoff value, to pass from the second output node to the second transducer only frequency components of the second amplified signal having frequency above a second cutoff value, to pass from the first output node to the first transducer a first filtered frequency component in response to the amplified frequency component of the first amplified signal, and to pass from the second output node to the second transducer a second filtered frequency component in response to the amplified frequency component of the second amplified signal, the low pass network is coupled with the third transducer between the first output node and the second output node in parallel with the high pass network, the first transducer, and the second transducer, with the low pass network having a first portion coupled between the first output node and the third transducer and a second portion coupled between the second output node and the third transducer, and the low pass network is configured to pass to the third transducer only frequency components of the first amplified signal and the second amplified signal having frequency below a third cutoff value, the first transducer branch is coupled between the first output node and the second output node and has a third node, the first transducer is coupled to the third node with a first polarity, the second transducer is coupled to the third node with a polarity opposite to the first polarity so that the first transducer and the second transducer introduce a phase shift, in the second filtered frequency component relative to the first filtered frequency component, which cancels said phase delay, the first transducer branch radiates sound indicative of a right stereo channel and a left stereo channel in response to the first amplified signal and the second amplified signal, and the third transducer radiates sound indicative of a subwoofer channel in response to the first amplified signal and the second amplified signal.

17. The system of claim 16, wherein the first cutoff value is at least substantially equal to the second cutoff value, and the second cutoff value is at least substantially equal to the third cutoff value.

18. The system of claim 16, wherein the first transducer is coupled to the second transducer at the third node, and also including a capacitor coupled between a system reference node and the third node.

19. The system of claim 16, wherein the amplification circuitry is implemented as an integrated circuit.

20. A method for generating multi-channel sound in response to input signals indicative of multiple audio channels, said method comprising the steps of:

amplifying a first one of the input signals and a second one of the input signals with low peak current demand even when the first one of the input signals and the second one of the input signals have highly correlated frequency components, to generate a first amplified signal in response to the first one of the input signals and a second amplified signal in response to the second one of the input signals, including by generating an amplified frequency component of the first amplified signal in response to a frequency component of said first one of the input signals having a first frequency and a first input signal phase, said amplified frequency component of the first amplified signal having a first phase, and generating an amplified frequency component of the second amplified signal in response to a frequency component of said second one of the input signals having the first frequency and a phase at least substantially equal to the first input signal phase, so that the amplified frequency component of the second amplified signal has a second phase which lags the first phase by a phase delay at least substantially equal to one-half cycle of the frequency component of the second one of the input signals; and driving a first transducer coupled with a first polarity between a first output node and a second output node, a second transducer coupled with a second polarity in series with the first transducer between the first output node and the second output node, and a third transducer connected in parallel with the first transducer and the second transducer between the first output node and the second output node, by asserting the first amplified signal to the first output node and asserting the second amplified signal to the second output node thereby causing the first transducer, the second transducer, and the third transducer to emit said multi-channel sound, wherein the first transducer and the second transducer radiate sound indicative of a right stereo channel and a left stereo channel in response to the first amplified signal and the second amplified signal, and the third transducer radiates sound indicative of a subwoofer channel in response to the first amplified signal and the second amplified signal, wherein the second polarity is opposite to the first polarity so that the first transducer and the second transducer introduce a phase shift, in the amplified frequency component of the second amplified signal relative to the amplified frequency component of the first amplified signal, which cancels said phase delay.

21. The method of claim 20, wherein the first amplified signal is generated by amplifying the first one of the input signals in a non-inverting manner, and the second amplified signal is generated by amplifying the second one of the input signals in an inverting manner.

22. A method for generating multi-channel sound in response to input signals indicative of multiple audio channels, said method comprising the steps of:

amplifying a first one of the input signals and a second one of the input signals with low peak current demand even when the first one of the input signals and the second one of the input signals have highly correlated frequency components, to generate a first amplified signal in response to the first one of the input signals and a second amplified signal in response to the second one of the input signals, including by generating an amplified frequency component of the first amplified signal in response to a frequency component of said first one of the input signals having a first frequency and a first input signal phase, said amplified frequency component of the first amplified signal having a first phase, and generating an amplified frequency component of the second amplified signal in response to a frequency component of said second one of the input signals having the first frequency and a phase at least substantially equal to the first input signal phase, so that the amplified frequency component of the second amplified signal has a second phase which lags the first phase by a phase delay at least substantially equal to one-half cycle of the frequency component of the second one of the input signals; and driving a first branch connected between a first output node and a second output node, and a second branch connected in parallel with the first branch between the first output node and the second output node, where the first branch includes a first transducer coupled with a first polarity between the first output node and the second output node and a second transducer coupled with a second polarity in series with the first transducer between the first output node and the second output node, and the second branch includes a third transducer, by asserting the first amplified signal to the first output node and asserting the second amplified signal to the second output node, high pass filtering the first amplified signal in the first branch to generate a first filtered signal including by generating a first filtered frequency component in response to the amplified frequency component of the first amplified signal, high pass filtering the second amplified signal in the first branch to generate a second filtered signal including by generating a second filtered frequency component in response to the amplified frequency component of the second amplified signal, and low pass filtering the first amplified signal and the second amplified signal in the second branch to generate a third filtered signal, thereby causing the first transducer, the second transducer, and the third transducer to emit said multi-channel sound, wherein the first transducer and the second transducer radiate sound indicative of a right stereo channel and a left stereo channel in response to the first filtered signal and the second filtered signal, and the third transducer radiates sound indicative of a subwoofer channel in response to the third filtered signal, wherein the second polarity is opposite to the first polarity so that the first transducer and the second transducer introduce a phase shift, in the first filtered frequency component relative to the second filtered frequency component, which cancels said phase delay.

23. The method of claim 22, wherein the first amplified signal is generated by amplifying the first one of the input signals in a non-inverting manner, and the second amplified signal is generated by amplifying the second one of the input signals in an inverting manner.

* * * * *